(12) United States Patent
Iravani et al.

(10) Patent No.: US 8,716,791 B1
(45) Date of Patent: May 6, 2014

(54) LDMOS WITH CORRUGATED DRIFT REGION

(75) Inventors: Farshid Iravani, Cupertino, CA (US); Timothy K. McGuire, Beaverton, OR (US)

(73) Assignee: Maxim Integrated Products, Inc., San Jose, CA (US)

( * ) Notice: Subject to any disclaimer, the term of this patent is extended or adjusted under 35 U.S.C. 154(b) by 144 days.

(21) Appl. No.: 13/207,815

(22) Filed: Aug. 11, 2011

(51) Int. Cl.
*H01L 29/66* (2006.01)

(52) U.S. Cl.
USPC ............ 257/339; 257/374; 257/397; 257/510

(58) Field of Classification Search
USPC .................................. 257/339, 374, 397, 510
See application file for complete search history.

(56) References Cited

U.S. PATENT DOCUMENTS

| 7,235,451 B2 * | 6/2007 | Hao et al. ...................... 438/306 |
| 7,928,508 B2 * | 4/2011 | Yao et al. ....................... 257/342 |
| 2009/0127626 A1 * | 5/2009 | Zhu et al. ....................... 257/368 |
| 2009/0140335 A1 * | 6/2009 | Schneider et al. ............ 257/344 |

OTHER PUBLICATIONS

Sun, Xin; Nanoscale Bulk MOSFET Design and Process Technology for Reduced Variablility; Electrical Engineering and Computer Sciences, University of California at Berkeley; Technical Report No. UCB/EECS-2010-80; May 14, 2010.

* cited by examiner

*Primary Examiner* — Tan N Tran
(74) *Attorney, Agent, or Firm* — Advent, LLP

(57) ABSTRACT

Semiconductor devices, such as LDMOS devices, are described that include a plurality of trench regions formed in an extended drain region of the devices. In one or more implementations, the semiconductor devices include a substrate having an extended drain region, a source region, and a drain region, all of the first conductivity type, formed proximate to a surface of the substrate. A gate is positioned over the surface and between the source region and the drain region. The gate is configured to receive a voltage so that a conduction region may be formed at least partially below the gate to allow charge carriers (e.g., majority carriers) to travel between the source region and the drain region. A plurality of trench regions are formed within the extended drain region that are configured to increase resistivity within the extended drain region when charge carriers travel between the source region and the drain region.

8 Claims, 5 Drawing Sheets

LDMOS WITH CORRUGATED DRIFT REGION

BACKGROUND

Laterally diffused metal oxide semiconductor (LDMOS) devices are used in power application devices because they complement both bipolar devices and complementary metal-oxide-semiconductor CMOS devices through bi-polar-CMOS-DMOS (BCD) processes. For example, LDMOS devices may be used in radio frequency amplifier devices and microwave power amplifier devices to furnish power application functionality. LDMOS devices may rely on a shallow conduction layer formed under a LOCOS ("local oxidation of silicon") region or a STI (shallow trench isolation) region to handle the higher drain voltage, when the device is biased.

The on-state resistance ("$R_{ON}$") and the maximum breakdown voltage ("$BV_{DSS}$") of the device are two important characteristics of LDMOS designs. These characteristics are important operating parameters of the LDMOS devices, which dictate the applications with which the devices may be utilized. On-state resistance is usually dependent upon the design and layout of the device, the process condition, temperature, drift region length, doping concentration of the drift region, and the various materials used to fabricate the devices. Breakdown voltage is defined as the largest reverse voltage that can be applied to the drain of the transistor without causing an exponential increase in the current.

SUMMARY

Semiconductor devices, such as LDMOS devices, are described that include a plurality of trench regions formed in an extended drain region (e.g., drift region) of the devices. In one or more implementations, the semiconductor devices include a substrate having an extended drain region, a source region, and a drain region, all of the first conductivity type, formed proximate to a surface of the substrate. A gate is positioned over the surface and between the source region and the drain region. The gate is configured to receive a voltage so that a conduction region may be formed at least partially below the gate to allow charge carriers (e.g., majority carriers) to travel between the source region and the drain region. The device includes a plurality of trench regions formed within the extended drain region that are configured to increase resistivity within the extended drain region when charge carriers travel between the source region and the drain region.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DRAWINGS

The detailed description is described with reference to the accompanying figures. The use of the same reference numbers in different instances in the description and the figures may indicate similar or identical items.

DETAILED DESCRIPTION

Overview

LDMOS transistor devices are utilized when microelectronic devices require higher voltages and higher power. The on-state resistance and the breakdown voltage (e.g., operating voltage) are important characteristics when developing these devices. Therefore, devices having higher breakdown voltages and lower on-state resistance are desired. For example, increasing the drift area length increases the breakdown voltage; however, this also increases the on-state resistance, which is an undesired effect.

Therefore, techniques are described to form semiconductor devices, in particular LDMOS devices, that include a plurality of trench regions formed in an extended drain region (e.g., drift region) of the devices. In one or more implementations, the semiconductor devices include a substrate having an extended drain region, a source region, and a drain region, all of the first conductivity type, formed proximate to a surface of the substrate. For example, the first conductivity type may comprise an n-type dopant. A gate is positioned over the surface and between the source region and the drain region. The gate is configured to receive a voltage so that a conduction region may be formed at least partially below the gate to allow charge carriers (e.g., majority carriers) to travel between the source region and the drain region. The device also includes a plurality of trench regions formed within the extended drain region that are configured to increase resistivity within the extended drain region when charge carriers travel between the source region and the drain region. In one or more implementations, a conductive layer may be implanted proximate to the sides of the extended drain region to provide increased drive current, in the case of a conductive layer of a first conductivity type (e.g., n-type dopant), within the extended drain region or to provide increased resistivity, in the case of a conductive layer of a second conductivity type (e.g., p-type dopant), within the extended drain region. Moreover, one or more types of filler material may at least partially fill the trench regions to further modify the electric field within the semiconductor device when the device is operational.

In the following discussion, an example semiconductor device is first described. Exemplary procedures are then described that may be employed to fabricate the example semiconductor device.

Example Implementations

Figure 1A:
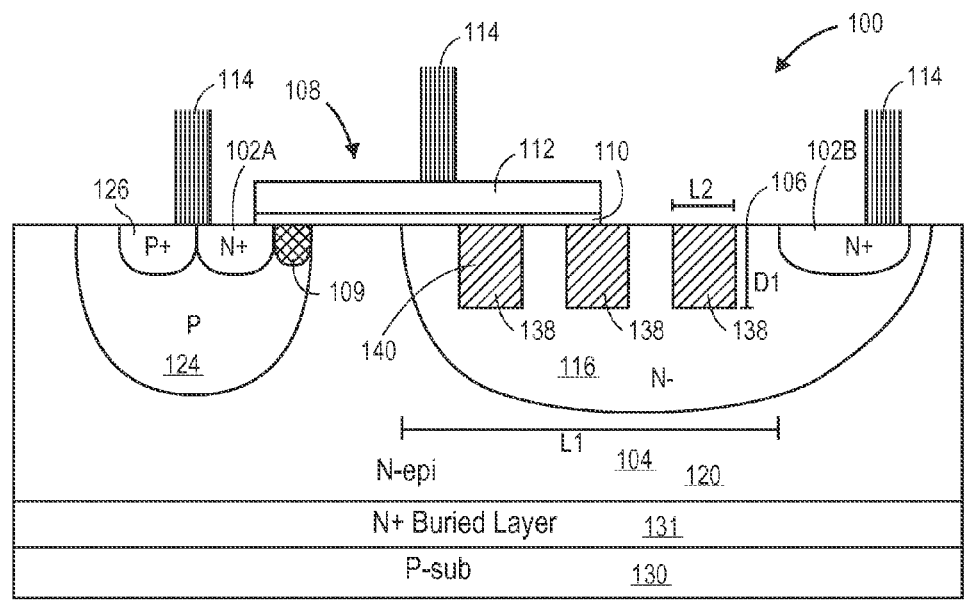
FIG. 1A is a diagrammatic partial cross-sectional view illustrating an implementation of a LDMOS device in accordance with an example implementation of the present disclosure.
Figure 2A:
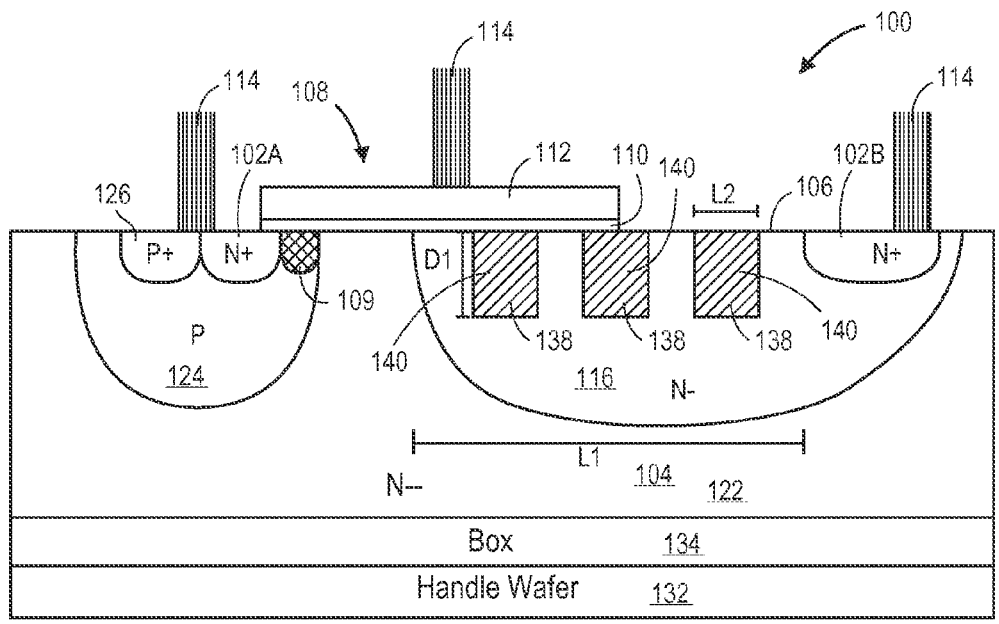
FIG. 2A is a diagrammatic partial cross-sectional view illustrating another implementation of a LDMOS device in accordance with another example implementation of the present disclosure.
Figure 2B:
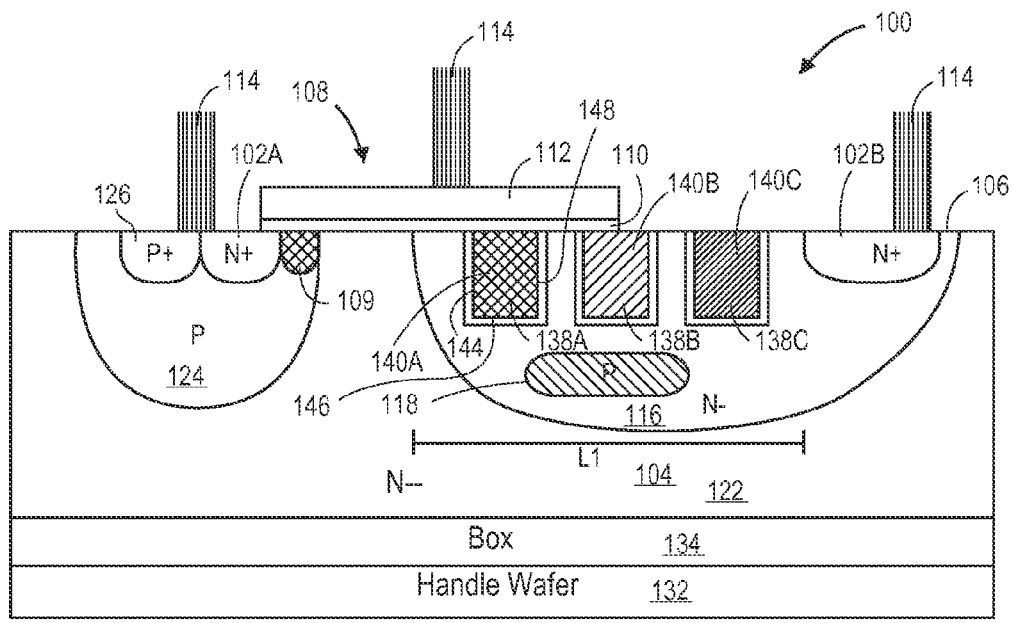
FIG. 2B is a diagrammatic partial cross-sectional view illustrating another implementation of a LDMOS device in accordance with another example implementation of the present disclosure.

FIGS. 1A and 2B illustrate lateral diffused MOS (LD-MOS) semiconductor devices 100 in accordance with example implementations of the present disclosure. For purposes of description, the LDMOS device 100 is illustrated at wafer level prior to singulation of the device 100. As shown, the LDMOS device 100 includes one or more active regions 102 (e.g., a source region 102A, a drain region 102B) formed in a substrate 104. The active regions 102 are utilized to create integrated circuit device technology (e.g., complementary metal-oxide-semiconductor (CMOS) technology, microelectromechanical systems (MEMS) technology, etc.). The active regions 102 may be configured in a variety of ways. In an implementation, the active regions 102 are capable of providing charge carriers to the substrate 104. For example, an active silicon region 102 may be comprised of an n-type diffusion region (e.g., a first conductivity type) that is capable of providing extra conduction electrons as charge carriers. In another example, an active silicon region 102 may be comprised of a p-type diffusion region (e.g., a second conductivity type) that is capable of providing extra holes as charge carriers. The one or more active regions 102 are formed proximate to a surface 106 of the substrate 104.

The substrate 104 comprises a base material utilized to form one or more integrated circuit devices through various semiconductor fabrication techniques, such as photolithography, ion implantation, deposition, etching, and so forth. In one or more implementations, the substrate 104 comprises a portion of a silicon wafer that may be configured in a variety of ways. For example, the substrate 104 may comprise a portion of an n-type silicon wafer or a portion of a p-type silicon wafer. In an implementation, the substrate 104 may comprise group V elements (e.g., phosphorus, arsenic, antimony, etc.) configured to furnish n-type charge carrier elements. In another implementation, the substrate 104 may comprise group MA elements (e.g., boron, etc.) configured to furnish p-type charge carrier elements.

The devices 100 also include a gate 108 that is formed over the surface 106 and between the active regions 102A, 102B. A conduction region 109 is formed below the gate 108 when a voltage of correct polarity and a value greater than a threshold voltage ($V_t$) of the device 100 is applied to the gate 108. The conduction region 109 establishes a conducting channel through which charge carriers (e.g., majority carriers) can travel between the source region 102A and the drain region 102B. The gate 108 is configured in a variety of ways. The gate 108 may include a layer 110, such as a dielectric layer, disposed between the surface 106 and a layer 112, such as a polycrystalline silicon (polysilicon) layer or a metal electrode layer. In one or more implementations, the layer 110 may comprise a gate oxide material, such as silicon dioxide ($SiO_2$), a nitride material, a high-κ material, or the like. Moreover, the layer 112 may include a silicide material to lower the resistivity of the layer 112. The thickness of the gate 108 may vary as a function of the requirements (e.g., manufacturability, operating frequency, gain, efficiency, etc.) of the device 100. For example, the thickness of the gate may range from approximately one hundred (100) Angstroms to approximately one hundred thousand (100,000) Angstroms.

The active regions 102A, 102B and the gate 108 each have a contact (e.g., an electrode) 114 that provides electrical interconnection capabilities between various components of devices 100. The contacts 114 may be configured in a variety of ways. For example, the contacts 114 may be comprised of a polysilicon material, a metal one (metal 1) material, a metal two (metal 2) material, and so forth. The contacts 114 may include vias (not shown) that provide a vertical electrical connection between different layers of the device 100. For instance, a first via may provide an electrical interconnect to a drain contact 114 formed proximate to the surface 106 and disposed under various device 100 layers (e.g., passivation layers, insulation layers, etc.).

Figure 1B:
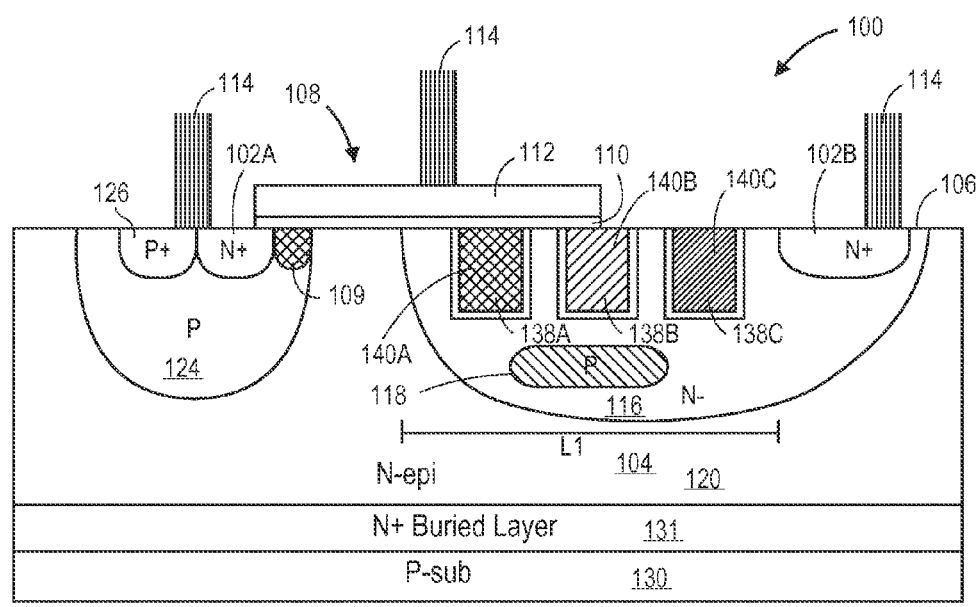
FIG. 1B is a diagrammatic partial cross-sectional view illustrating another implementation of a LDMOS device in accordance with another example implementation of the present disclosure.

The semiconductor device 100 also includes an extended drain region 116 (e.g., a drift region). As illustrated in FIGS. 1A through 2B, the extended drain region 116 surrounds the drain region 102B. In one or more implementations, as shown in FIGS. 1B and 2B, the extended drain region 116 may also serve in conjunction with a conductivity type opposite the conductivity type of the extended drain region 116 to form a reduced surface field (RESURF) region 118 that functions to create a uniform drift region field to manipulate the device 100 breakdown voltage. The electric field across the drift region may be manipulated by the doping profile and the thickness of the extended drain region 116. Thus, it is contemplated that various doping profiles and thicknesses of the extended drain region 116 may be utilized depending on the requirements (e.g., breakdown voltage value, operating voltages, etc.) of the LDMOS devices 100. In one or more implementations, the extended drain region 116 may be formed from a dopant dose (of the first conductivity type) of approximately $1\times10^{11}/cm^2$ to approximately $1\times10^{14}/cm^2$. However, it is contemplated that other dopant doses may be utilized depending on the requirements (e.g., the on-state resistance, etc.) of the devices 100. The extended drain region 116 is bounded by either an epitaxial region (e.g., n-epitaxial region formed on a p-substrate substrate) 120 (shown in FIGS. 1A and 1B) or a first conductivity region (e.g., an n-type region) 122 (shown as an n—region in FIGS. 2A and 2B). The n-type region 122 is configured to reduce the electric field across the device 100 to enable a higher operating voltage as well as reducing the series resistance of the device 100. In one or more implementations, the doping level of the extended drain region 116 is approximately three (3) times greater than the doping level of the n-type region 122. In one or more implementations, the n-type region 122 may have a doping profile ranging from approximately $3\times10^{14}/cm^3$ to approximately $3\times10^{18}/cm^3$. In an implementation, the length (L1) of the extended drain region 116 may be twenty-four (24) microns for a six hundred (600) volt LDMOS device or twelve (12) microns for a three hundred (300) volt LDMOS device.

As shown in FIGS. 1A through 2B, the epitaxial layer 120 and the n-type region 122 at least substantially surround the well region 124. The well region 124 is comprised of a second conductivity type (e.g., a p-well) and is at least partially covered by the gate 108. The source region 102A and the back-gate contact (e.g., body contact) region 126 are included in the well region 124. In one or more implementations, the source region 102A is comprised of a first conductive type, such as an n+ dopant material. The back-gate region 126 is comprised of a second conductive type, such as a p+ dopant material. In one or more implementations, the back-gate region 126 and the source region 102A are tied together with a source electrode 128 (e.g., contact 114) to reduce parasitic effects.

FIGS. 1A and 1B illustrate the LDMOS devices 100 fabricated in a bulk substrate 130 of a second conductive type, such as a p-substrate. In this implementation, a buried layer 131 of a first conductivity type (e.g., N+ buried layer) may be disposed between the epitaxial layer 120 and the bulk substrate 130. In another implementation, as shown in FIGS. 2A and 2B, the LDMOS devices 100 are fabricated with a substrate 104 that is bonded to a handle wafer 132 with a buried oxide (Box) layer 134 disposed between the handle wafer 132 and the substrate 104 (e.g., region 122). The handle wafer 132 is bonded to the substrate 104 and serves to hold the various components of device 100 (e.g., active regions 102, gate 108, etc.) in at least a substantially fixed position with respect to each other during various fabrication processes. In one or more implementations, the handle wafer 132 may be bonded to a bottom surface 136 of the substrate 104 with a suitable temporary adhesive material. The Box layer 134 serves to reduce parasitic effects through the substrate 104 as compared to bulk substrate configuration (e.g., the bulk substrate 130) as shown in FIGS. 1A and 1B.

The LDMOS device 100 includes two or more trench regions 138 formed in the extended drain region 116. As shown in FIGS. 1 through 2, the trench regions 138 are formed in the surface 106 so that the trench regions 138 at least partially extend into the extended drain region 116. The multiple trench regions 138 may be configured in a variety of ways. For example, the trench regions 138 may be configured as alternating trench regions 138 or corrugated trench regions 138. In one or more implementations, the trench regions 138 may be formed utilizing shallow trench isolation techniques. In another example, the trench regions 138 may be formed utilizing deep trench isolation techniques. Multiple trench regions 138 may also assume different depths. For example, a first trench region 138 may be shallower than an adjacent trench, and so on. The trench regions 138 serve to allow optimization of the layout of the device 100. In an implementation, for a given breakdown voltage and doping profile (e.g., doping level) of the drift region, a number of trench regions 138 may be chosen to allow for a more compact LDMOS device 100. In this implementation, the trench regions 138 serve to provide a resistance that allows for shortening of the extended drain region 116 (e.g., drift region) so that the resistance is approximately equal to a drift region having a longer length and no trench regions 138 or a single wide trench region 138. Thus, a single trench region may be replaced with multiple narrower trench regions (e.g., trench regions 138), which effectively reduces the lateral dimensions of the single trench. For example, for a LDMOS device 100 having a voltage breakdown of seven hundred (700) volt and an extended drain region 116 having a concentration of dopant of a first conductivity type of approximately $1 \times 10^{14}/cm^3$ to approximately $3 \times 10^{15}/cm^3$, the length (L1) of the extended drain region 116 having multiple trench regions 138 may be approximately twenty-four (24) microns instead of approximately sixty-five (65) microns, which may be the length of an LDMOS device having the same parameters stated above (e.g., 700 volt breakdown voltage, etc.), absent the trench regions 138.

The trench regions 138 may also serve to increase the effective resistance in the extended drain region 116 to allow for increased drive current (e.g., higher doping of the extended drain region 116) to, for the same on-state resistance, increase the breakdown voltage by replacing a single trench region with multiple trench regions 138. Typically, an increased drive current decreases the on-state resistance; however, the increased drive current may also decrease the breakdown voltage absent the increased effective resistance provided by the trench regions 138. Moreover, while FIGS. 1A through 2B illustrate three (3) trench regions 138, it is contemplated that there may be more or less than three (3) trench regions 138 with equal or different depths depending upon the specific design and/or application requirements of the LDMOS device 100 (e.g., desired breakdown voltage, desired length of extended drain region 116, desired on-state resistance, etc.) and whether the device with a single trench region is retrofitted with multiple trench regions 138 (limited by the number of trench regions that can be placed on the available drift length) or whether the device 100 is designed with the consideration of having multiple trench regions 138.

As described above, the trench regions 138 may be formed through one or more suitable fabrication techniques. The length (L2) and the depth (D1) of the trench regions 138 vary as a function of the desired design parameters. For example, the length and the depth of the trench regions 138 may be a function of the desired breakdown voltage, a function of the desired length (L1) of the extended drain region 116, a function of the doping profile of the extended drain region 116, combinations thereof, and so forth. In an implementation, the length and the depth of one or more trench regions 138 may be about two (2) microns by about two (2) microns. In another implementation, the length and the depth of one or more trench regions 138 may be about seven (7) microns by about seven (7) microns. It is contemplated that all of the trench regions 138 may be uniform depth and length. It is also contemplated that each isolation region 138 may have differing depths and lengths. For example, a first isolation region 138 may have a first depth and a first length (e.g., about (2) microns by about two (2) microns) and a second isolation region 138 may have a second depth and a second length (e.g., about seven (7) microns by about seven (7) microns). While n×n (depth by length) configurations are described above, where n is the number of microns associated with an isolation region 138, the trench regions 138 may also be implemented in m×n configurations (e.g., a depth that differs from the length of each isolation region 138), such as a two (2) micron by four (4) micron isolation region 138.

As illustrated in FIGS. 1A through 2B, a filler material 140 may at least partially fill the trench regions 138. The filler material 140 may be configured in a variety of ways. For example, the filler material 140 may comprise a low-κ dielectric material, such as a fluorine-doped silicon dioxide material, a carbon-doped silicon dioxide material, a porous silicon dioxide material, or the like. The low-κ dielectric material may serve to at least partially reduce parasitic capacitance and reduce crosstalk between various regions of the device 100. Moreover, the low-κ dielectric material modifies the electric field between the source 102A and the drain 102B when the device 100 is operational. In another example, the filler material 140 may comprise a high-κ dielectric material, such as hafnium dioxide ($HfO_2$), zirconium dioxide ($ZrO_2$), titanium dioxide ($TiO_2$), or the like. The high-κ dielectric material may also modify the electric field between the source 102A and the drain 102B when the device 100 is operational. The filler material 140 may also comprise a silicon dioxide material.

As shown in FIGS. 1B and 2B, each isolation region 138 may include a different filler material 140. For example, a first trench region 138A includes a first filler material 140A (e.g., a high-κ dielectric material), a second trench region 138B includes a second filler material 140B (e.g., a silicon dioxide material), and a third trench region 138C includes a third filler material 140C (e.g., low-κ dielectric material). It is contemplated that other permutations of filler material 138 configurations are possible (e.g., second isolation region 138B is also filled with a high-κ dielectric material, or second isolation region 138B is filled with a low-κ dielectric material and third isolation region 138C is filled with high-κ dielectric material, and so forth). The permutations of the filler material(s) 138 depend on the desired characteristics (e.g., breakdown voltage, drive current, length of the extended drain region 116, etc.) of the LDMOS device 100.

As shown in FIGS. 1B and 2B, one or more conductive layer(s) 142 may be formed (e.g., deposited) around the sides 144, 146, 148 of the trench regions 138. The conductive layers 142 may be configured in a variety of ways. For example, the conductive layer 142 may comprise a first conductivity type (e.g., n-type dopant). It is contemplated that in one or more implementations, the first conductivity type doping profile of the conductive layer 142 may be greater (e.g., a doping profile of approximately $1\times10^{16}/cm^3$ to approximately $1\times10^{18}/cm^3$) than the doping profile of the first conductivity type of the extended drain region 116. Therefore, in this example, the first conductive layer 142 may assist in boosting the drive current through the extended drain region 116, which may at least partially decrease the on-state resistance of the device 100. In another example, the conductive layer 142 may comprise a second conductivity type (e.g., p-type dopant) that may at least partially function in the same respect as the RESURF region 118. When the conductive layer 142 comprises a second conductivity type, the conductive layer 142 may at least partially function to create a uniform drift region electric field to assist in manipulating the LDMOS device 100 breakdown voltage. The second conductive type doping profile of the conductive layer 142 may range from approximately $1\times10^{14}/cm^3$ to approximately $1\times10^{16}/cm^3$. In one or more implementations, the thickness of the conductive layer 142 may range from approximately $1\times10^{16}/cm^3$ to approximately $1\times10^{18}/cm^3$. However, other thicknesses are contemplated as the thickness of the conductive layer 142 is a function of the doping profile (e.g., deposition steps).

While not shown, the LDMOS device 100 may also include field plates that are formed over one or more interlayer-dielectric regions disposed over the surface 106. The field plates may be strategically positioned to assist in shaping the electric field under the gate 108 (and the LOCOS region 116) to improve the breakdown voltage when the devices 100 are operational (e.g., when a sufficient voltage is applied to the gate 108 and across the source 102A and the drain 102B).

It will be understood that while FIGS. 1A through 2B illustrate an n-channel LDMOS device 100, the devices 100 may be fabricated as p-channel devices. For example, a p-channel device may include p-type source and drain regions, a p-type extended drain region, and so forth.

Example Fabrication Processes

Figure 3:
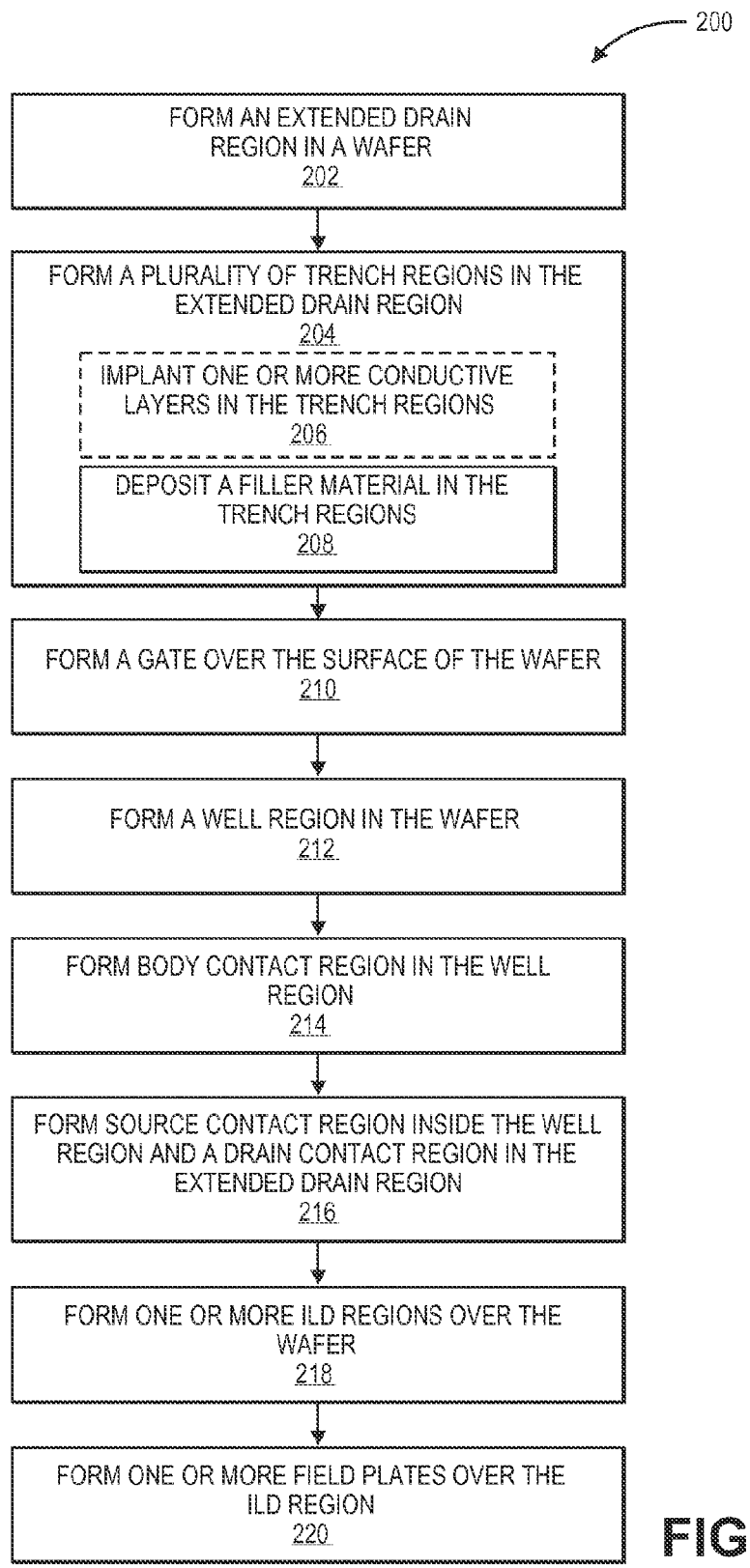
FIG. 3 is a flow diagram illustrating a process in an example implementation for fabricating LDMOS devices, such as the devices shown in FIGS. 1A and 1B.
Figure 4:
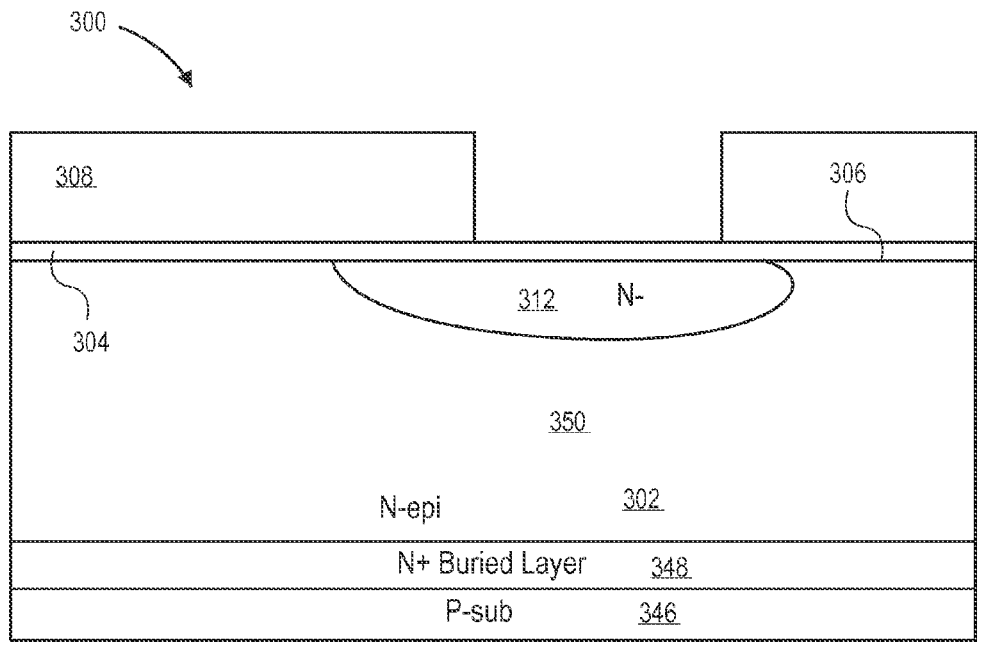
FIGS. 4 through 7 are diagrammatic partial cross-sectional views illustrating the fabrication of a LDMOS device, such as the device shown in FIG. 1A, in accordance with the process shown in FIG. 3.

FIG. 3 illustrates an example process 200 that employs semiconductor fabrication techniques to fabricate semiconductor devices, such as the devices 100 shown in FIGS. 1A through 2B. FIGS. 4 through 7 illustrate formation of example LDMOS devices 300 in an example wafer 302. As illustrated in FIG. 3, an extended drain region is formed in a wafer (Block 202). In one or more implementations, as shown in FIG. 4, a pad oxide layer 304 is formed over a surface 306 of the wafer 302. A nitride layer 308 is formed over the pad oxide layer 304. The nitride layer 308 is patterned and etched to expose an area 310, and a first conductive material (e.g., n-type dopant) is implanted through the exposed area 310 into the wafer 302 to form the extended drain region 312 as shown in FIG. 4. Thermal cycling is then utilized to anneal and at least partially diffuse the extended drain region 312. Once the regions 312 are formed, the pad oxide layer 304 and the nitride layer 308 are removed. In one or more implementations, the layers 304, 308 are removed via a suitable etching technique, such as a plasma etch, or the like.

Figure 5:
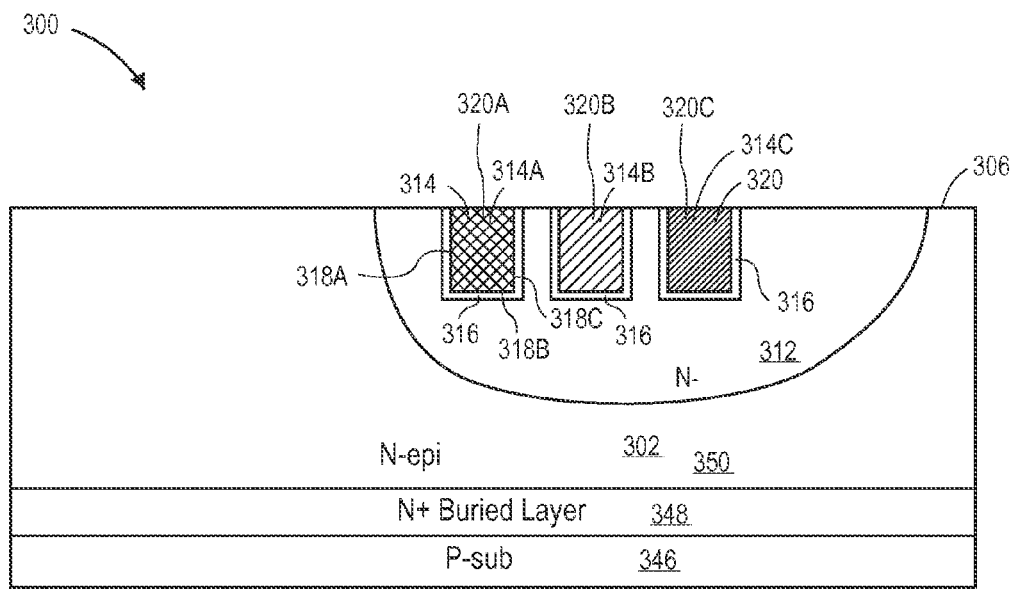

A plurality of trench regions are then formed in the extended drain region (Block 204). As shown in FIG. 5, the trench regions 314 may be formed by selectively etching the surface 306 of the wafer 302 over the extended drain region 312. For example, a photoresist (not shown) may first be applied to the surface 306. Then, a photolithography process is applied to the photoresist to selectively pattern the photoresist to allow for etching of the patterned areas. As described above, the trench regions 314 may vary in depth and length. The depth and the length of the trench regions 314 may be a function of the desired characteristics of the device 100. For example, the depth and the length may be formed in an n×n (e.g., two (2) by two (2) microns) configuration or an m×n (e.g., three (3) microns by four (4) microns) configuration. It is contemplated that both shallow trench isolation techniques and deep trench isolation techniques may be utilized to form one or more of the trench regions 314. In an implementation, a first trench region 314 may be formed through a shallow trench isolation process and a second trench region 314 may be formed through a deep trench isolation process. In another implementation, a first trench region 314 may be formed through a single shallow trench isolation process and a second trench region 314 may be formed through a double shallow trench isolation process. However, trench formation processes are contemplated as well. The trench regions 314 may serve to increase the resistivity in the extended drain region 312. The increased resistivity may allow for shortening of the extended drain region 312 (as described above) or allow for an increased drive current (e.g., increased doping in the extended drain region 312). In an implementation, the trench regions 314 may be spaced (S1) about one (1) to about five (5) microns apart. One or more conductive layers may then implanted in the trench regions (Block 206). In one or more implementations, as shown in FIG. 5, conductive layers 316 may be implanted so that the conductive layers 316 are formed about the sides 318 (318A, 318B, 318C) of the trench regions 314. As described above, the conductive layers 316 may comprise a first conductivity type (e.g., n-type dopant) or may comprise a second conductivity type (e.g., p-type dopant). A conductive layer 316 of the first conductivity type may serve to increase the drive current in the extended drain region 312. Conversely, a conductive layer 316 of the second conductivity type may serve to increase the resistance in the extended drain region 312.

A filler material may then be deposited in the trench regions (Block 208). The filler material 320 may at least partially fill the trench regions 314. The filler material 320 may comprise a low-κ dielectric material (e.g., fluorine-doped silicon dioxide material, a carbon-doped silicon dioxide material, a porous silicon dioxide material, etc.), a high-κ dielectric material (e.g., hafnium dioxide ($HfO_2$), zirconium dioxide ($ZrO_2$), titanium dioxide ($TiO_2$), etc.), silicon dioxide, or the like. As described above with respect to FIG. 2, different filler materials 320 may at least partially fill different trench regions 314. For example, a first filler material 320A may at least partially fill a first trench region 314A, a second filler material 320B may at least partially fill a second trench region 314B, a third filler material 320C may at least partially fill a third trench region 314C, and so forth. However, it is also contemplated that a uniform filler material 320 may at least partially fill all of the trench regions 314.

Figure 6:
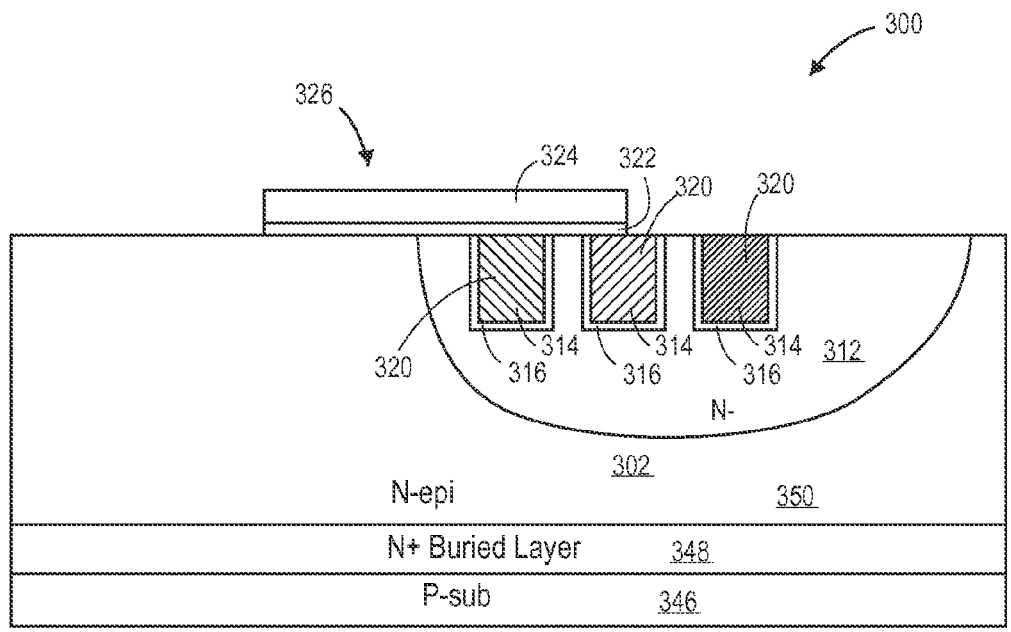

A gate is formed over the surface of the wafer (Block 210). In an implementation, as illustrated in FIG. 6, a gate oxide layer 322 is then formed over the surface 306. The gate oxide layer 322 may be thermally grown over the surface 306. It is contemplated that the gate oxide layer 322 thickness may vary as a function of differing voltage ratings. For example, a greater gate oxide layer 322 thickness may be utilized for greater operating voltage LDMOS devices than lower operating voltage LDMOS devices. For instance, the gate oxide layer 322 may be about one hundred (100) Angstroms for a sixty (60) volt device. A polysilicon layer 324 is then formed over the gate oxide layer 322. In one or more implementations, the polysilicon layer 324 may be formed over the gate oxide layer 322 via one or more suitable deposition techniques. The polysilicon layer 324 may then be doped with an impurity to render the layer 324 conductive. A photoresist (not shown) is then applied over the polysilicon layer 324 and selectively etched to form a gate 326. The gate 326 is configured to assist in generating a conduction layer beneath the gate 326 to allow majority carriers between the source and the drain of the LDMOS device 300 when the device 300 is operational.

Figure 7:
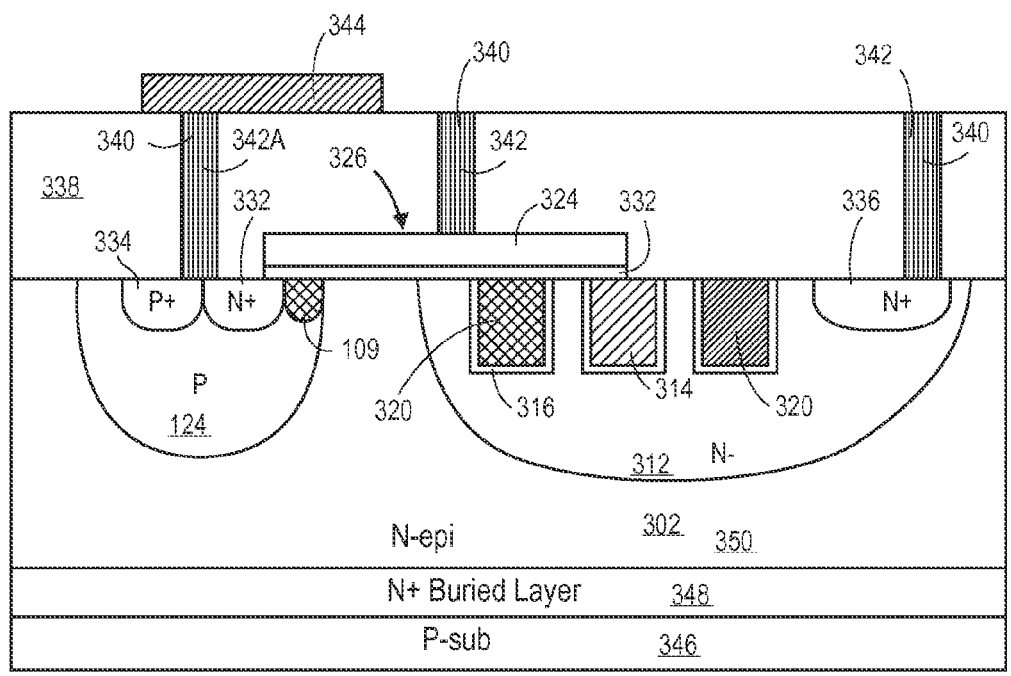

Once the gate is formed, a well region comprised of a second conductivity type is formed in the wafer (Block 212). As illustrated in FIG. 7, a well region 330 is formed in the wafer 302. In one or more implementations, the well region 330 is comprised of a p-type dopant that is annealed after deposition to form the region 330. A body contact (e.g., backgate) region is then formed in the well region (Block 214). In an implementation, the source region 332 (described below) is comprised of a first conductive type (e.g., an n-type dopant), and the body contact region 334 is comprised of a second conductive material (e.g., a p+ type dopant). Suitable semiconductor formation techniques (e.g., ion implantation, deposition, annealing, etc.) may be utilized to form the source region 332 and the backgate contact region 334.

As illustrated in FIG. 3, a source contact region (e.g., source region) inside the well region and a drain contact region (e.g., drain region) of a first conductivity type is formed in the extended drain region (Block 216). The extended drain region 312, as shown in FIGS. 4 through 7, has a lower doping level than the drain region 336. In one or more implementations, the extended drain region 312 may have a doping level ranging from approximately $1 \times 10^{15}/cm^3$ to approximately $8 \times 10^{18}/cm^3$. As described above, the length of the extended drain region 312 may vary as a function of the desired LDMOS device 300 characteristics (e.g., breakdown voltage, doping profile of the extended drain region 312, desired on-state resistance, etc.).

One or more ILD regions are formed over the surface of the wafer (Block 218). In one or more implementations, as illustrated in FIG. 7, one or more ILD regions 338 are formed (e.g., deposited) over the surface 306. The ILD regions 338 are configured to insulate the LDMOS device 300 components (e.g., gate 328, source region 332, drain region 336, etc.) from later semiconductor processing techniques.

Once the ILD region(s) 338 are formed, one or more vias (e.g., contacts) 340 are formed to allow connections to the gate 328, the source region 332, and the drain region 336. The vias 340 are formed through one or more suitable etching techniques (e.g., wet etch, dry etch, etc.). A conductive material is deposited in the vias 340 to form contacts 342 that provide electrical interconnections between various components of the device 100. In one or more implementations, the conductive material may be comprised of a polysilicon material, a metal 1 material, a metal 2 material, and so forth. As described above, the contacts 342 form electrodes for the source region 332 and the drain region 336. In one or more implementations, the contact 342A connects the source region 332 and the backgate contact region 334 together so that the source region 332 and the backgate contact region 334 are held at the same potential.

One or more field plate(s) are then formed over the ILD region (Block 214). As shown in FIG. 7, the field plate(s) 344 are configured to assist in shaping the electric field between the source region 332 and the drain region 336 to improve the breakdown voltage when the devices 300 are operational. The field plate 344 may be configured in a variety of ways. For example, the field plate 344 may be comprised of a conductive material, such as a metal material or a polysilicon layer.

In one or more implementations, the thickness of the field plate 344 may range from approximately two thousand (2000) Angstroms to approximately forty thousand (40,000) Angstroms. It is contemplated that the thickness of the field plate(s) 344 may be a function of the desired operating voltage.

The LDMOS devices 300 illustrated in FIGS. 4 through 7 are fabricated with a bulk substrate wafer (e.g., p-type substrate 346 with a N+ buried layer 348) having an n-epitaxial region 350 formed therein. However, it is contemplated that the devices can be fabricated with a SOI wafer that is positioned on a handle wafer. Moreover, while FIGS. 4 through 7 illustrate an n-channel LDMOS device 300, the devices 300 may also be fabricated as p-channel devices.

CONCLUSION

Although the subject matter has been described in language specific to structural features and/or process operations, it is to be understood that the subject matter defined in the appended claims is not necessarily limited to the specific features or acts described above. Rather, the specific features and acts described above are disclosed as example forms of implementing the claims.

What is claimed is:
1. A semiconductor device comprising:
   a substrate having an extended drain region of a first conductivity type, a source region of a first conductivity type, and a drain region of the first conductivity type formed proximate to a surface of the substrate, the drain region formed within the extended drain region;
   a RESURF region of a second conductivity type formed within the extended drain region;
   a gate disposed over the surface and between the source region and the drain region, the gate configured to receive a voltage; and
   a plurality of trench regions formed within the extended drain region, the plurality of trench regions disposed between the drain region and the source region, the plurality of trench regions configured to increase resistivity within the extended drain region when charge carriers travel between the source region and the drain region,
   wherein the RESURF region is disposed under the plurality of trench regions.
2. The semiconductor device as recited in claim 1, wherein the plurality of trench regions include a filler material that at least partially fills the plurality of trench regions.
3. The semiconductor as recited in claim 2, wherein a first trench region of the plurality of trench regions includes a first filler material and a second trench region of the plurality of trench regions includes a second filler material, the second filler material is different than the first filler material.
4. The semiconductor device as recited in claim 2, wherein the filler material comprises a low-κ dielectric material.
5. The semiconductor device as recited in claim 2, wherein the filler material comprises a high-κ dielectric material.
6. The semiconductor device as recited in claim 1, wherein a conduction layer is formed proximate to at least one side of the plurality of trench regions.
7. The semiconductor device as recited in claim 6, wherein the conduction layer comprises a first conductivity type.
8. The semiconductor device as recited in claim 6, wherein the conduction layer comprises a second conductivity type.

* * * * *